(12) United States Patent
Kichline, Jr.

(10) Patent No.: US 7,514,819 B2
(45) Date of Patent: Apr. 7, 2009

(54) SEMICONDUCTOR SWITCH ASSEMBLY FOR PULSE POWER APPARATUS

(75) Inventor: John L. Kichline, Jr., Reading, PA (US)

(73) Assignee: Dana Automotive Systems Group, LLC, Toledo, OH (US)

( * ) Notice: Subject to any disclaimer, the term of this patent is extended or adjusted under 35 U.S.C. 154(b) by 644 days.

(21) Appl. No.: 10/880,566

(22) Filed: Jul. 1, 2004

(65) Prior Publication Data

US 2006/0002050 A1    Jan. 5, 2006

(51) Int. Cl.
*H03K 3/00*    (2006.01)
*H03K 3/64*    (2006.01)
*H02J 1/00*    (2006.01)

(52) U.S. Cl. .................... 307/108; 307/80; 307/85
(58) Field of Classification Search ............. 361/155, 361/156; 307/80, 81, 85, 108
See application file for complete search history.

(56) References Cited

U.S. PATENT DOCUMENTS

| | | | |
|---|---|---|---|
| 3,678,362 A | 7/1972 | Amberger et al. ............... 320/1 |
| 4,024,430 A | 5/1977 | Schneider ..................... 315/289 |
| 5,425,570 A | 6/1995 | Wilkinson ..................... 299/14 |
| 5,689,520 A | 11/1997 | Hoang ......................... 372/38 |
| 5,767,592 A * | 6/1998 | Boys et al. ................... 307/108 |
| 5,978,283 A | 11/1999 | Hsu et al. ................. 365/189.09 |
| 6,144,115 A * | 11/2000 | Massie et al. .................. 307/80 |
| 6,388,276 B1 * | 5/2002 | Hirano et al. ................. 257/121 |
| 6,548,791 B2 * | 4/2003 | Kistersky et al. ............. 219/617 |
| 7,227,277 B2 * | 6/2007 | Chapman et al. ............... 307/43 |
| 2002/0140464 A1 | 10/2002 | Yampolsky et al. .......... 327/100 |
| 2002/0149414 A1 | 10/2002 | Glidden ....................... 327/438 |
| 2005/0093373 A1 * | 5/2005 | Chapman et al. ............... 307/80 |
| 2005/0128656 A1 * | 6/2005 | Croyle ......................... 361/18 |

FOREIGN PATENT DOCUMENTS

| | | |
|---|---|---|
| EP | 1 128 557 A | 8/2001 |
| SU | 1 654 919 A1 | 6/1991 |
| SU | 1654919 A1 * | 6/1991 |

* cited by examiner

*Primary Examiner*—Stephen W Jackson
*Assistant Examiner*—Hal I Kaplan
(74) *Attorney, Agent, or Firm*—Marshall & Melhorn, LLC

(57) ABSTRACT

A capacitor-type pulse power apparatus for generating an electric current power pulse through an electrical load, comprises a charging power supply and at least one pulse power supply module. The pulse power supply module includes at least one capacitor for storing an electrical energy supplied by the charging power supply and a semiconductor switch assembly having an input coupled to the capacitor for allowing the stored electrical energy to be transferred from the capacitor to the electrical load. The semiconductor switch allows current reversal in order to extend duration of application of the electrical energy through the electrical load.

18 Claims, 4 Drawing Sheets

SEMICONDUCTOR SWITCH ASSEMBLY FOR PULSE POWER APPARATUS

BACKGROUND OF THE INVENTION

1. Field of the Invention

The present invention relates to pulse power apparatuses in general and, more particularly, to a pulse power apparatus using a semiconductor switch assembly to pulse discharge an electrical current from a capacitor bank.

2. Description of the Prior Art

Conventionally, pulse power apparatuses employ ignitrons, vacuum switches, spark-gap switches or thyratrons as switching devices. The switching devices currently used in the pulse power apparatuses offer little consistency, are high expense, need frequent maintainance, and are incapable of production level reliability. Moreover, thery are inadequate in meeting life requirements of components of the pulse power equipment.

Accordingly, it is the intent of this invention to overcome these shortcomings of the prior art.

SUMMARY OF THE INVENTION

The present invention provides a novel pulse power apparatus for generating an electric current pulse through an electrical load.

The pulse power apparatus of the present invention comprises the electrical load, at least one pulse power supply module, and a charging power supply. The at least one pulse power supply module includes at least one capacitor for storing an electrical energy supplied by the charging power supply, and a semiconductor switch assembly having an input coupled to the at least one capacitor for allowing the stored electrical energy to be transferred from the at least one capacitor to the electrical load, while allowing current reversal in order to extend duration of application of the electrical energy through the electrical load.

The pulse power apparatus in accordance with the preferred embodiment of the present invention comprises a plurality of substantially identical pulse power supply modules connected in parallel with one another. Each of the plurality of pulse power supply modules includes a plurality of capacitors. The pulse power apparatus of the preferred embodiment further comprises a charging switch for allowing the electrical energy from the charging power supply to charge the capacitors of the pulse power supply modules and an electronic control module operatively coupled to the charging power supply, the charging switch and the semiconductor switch assembly of each of the plurality of pulse power supply modules.

Further preferably, the semiconductor switch assembly of each of the plurality of pulse power supply modules includes a semiconductor thyristor controlled by a pulse generator and a diode connected in parallel with said semiconductor switch so that the pulse generator is operated by the electronic control module. Thus, the pulse power apparatus of the present invention is provided with the ability to select the number of modules used in each pulse and to fine tune the shape of the pulse to a particular application.

Alternatively, the semiconductor switch assembly of each of the plurality of pulse power supply modules may include a reverse conducting thyristor controlled by the pulse generator to eliminate the diode.

Therefore, the pulse power apparatus in accordance with the present invention provides a reliable and consistent switching mechanism for pulse power, and a flexible pulse power supply.

BRIEF DESCRIPTION OF THE DRAWINGS

Other objects and advantages of the invention will become apparent from a study of the following specification when viewed in light of the accompanying drawings, wherein.

DETAILED DESCRIPTION OF PREFERRED EMBODIMENTS

The preferred exemplary embodiment of the present invention will now be described with the reference to accompanying drawings.

Figure 1:
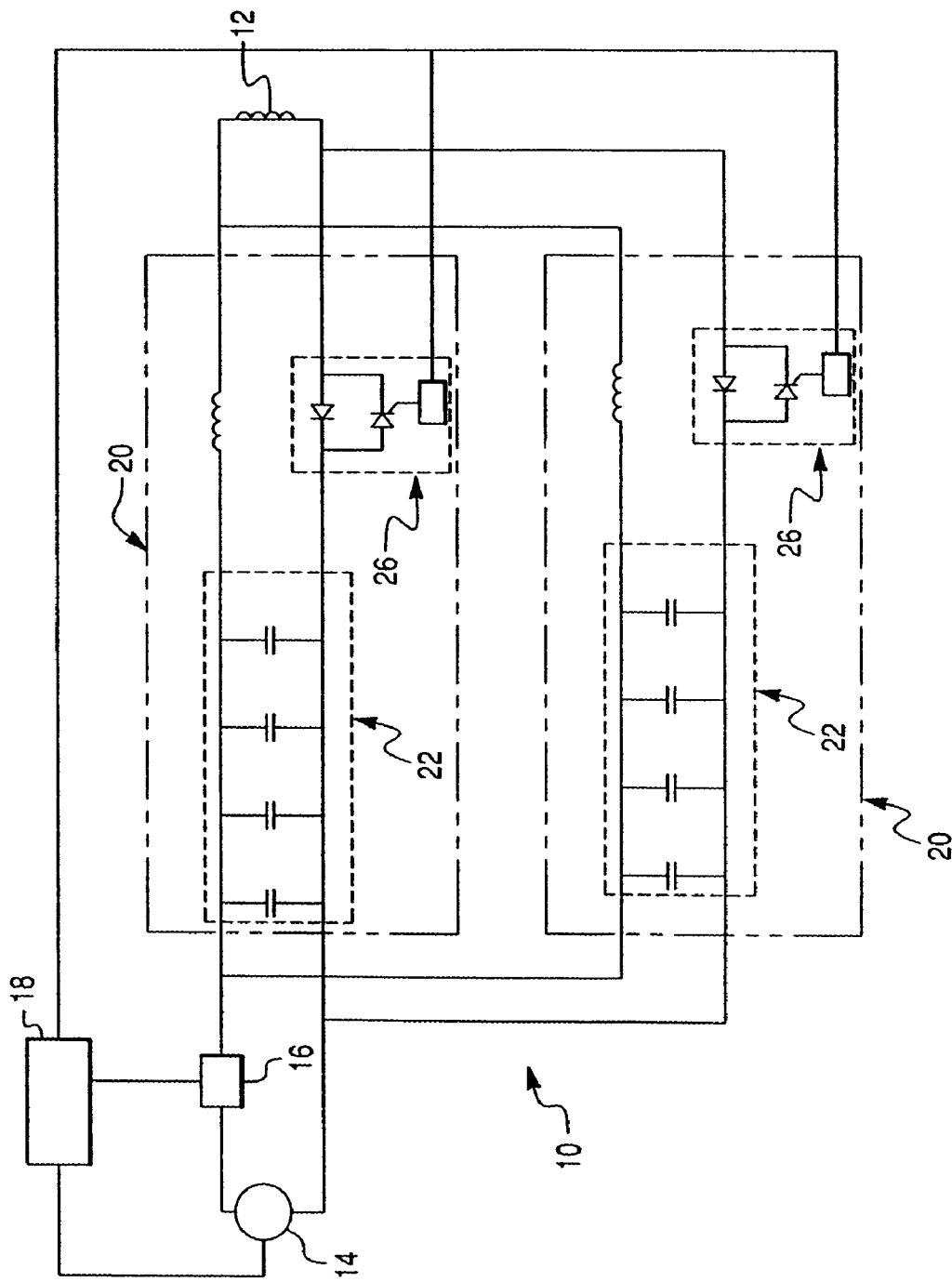
FIG. 1 is a schematic electrical circuit of a capacitor-type pulse power apparatus in accordance with the preferred exemplary embodiment of the present invention.

FIG. 1 depicts a preferred exemplary embodiment of a modular pulse power apparatus 10 in accordance with the present invention. Examples of the pulse discharge apparatus 10 may be magnetic pulse welding machines, discharge pulse generators for supplying power between a pair of electrodes, etc.

The modular pulse power apparatus 10 is provided to generate a large current pulse and comprises an electrical load 12, at least one pulse power supply module 20, a D.C. charging power supply 14, and a charging switch 16. Those skilled in the art would appreciate that the electrical load 12 may be in the form of any appropriate electrical power consuming element, such as an inductive coil of a magnetic pulse welding machine, a pair of electrodes, etc. In case when the electrical load 12 is the inductive coil of the magnetic pulse welding machine, a current pulse generated by the pulse discharge apparatus creates a magnetic field at a coil output, which is essential to creating a magnetic pulse weld.

Preferably, as illustrated in FIG. 1, the modular pulse discharge apparatus 10 of the present invention includes a plurality of the substantially identical pulse power supply modules 20 electrically connected in parallel with one another. It will be appreciated that the modular pulse power apparatus 10 of the present invention may include any number of the pulse power supply modules 20.

The modular pulse power apparatus 10 of the exemplary embodiment of the present invention further includes an electronic control module 18 electrically coupled to each of the plurality of the pulse power supply modules 20 and connected to both the electrical power source 14 and the charging switch 16. The electronic control module 18 is provided to control each the plurality of the pulse power supply modules 20, the timing of the charging power supply 14 and the charging switch 16. Preferably, the electronic control module 18 is a programmable logic control (PLC) or similar electronic controller. Further preferably, the electronic control module 18 controls each the plurality of the pulse power supply modules 20 independently and selectively, thus providing the pulse power apparatus 10 with the ability to select the number of modules 20 used in each pulse (i.e. operate a selected number of the plurality of the pulse power supply modules 20), and to fine tune the shape of the pulse to a particular application.

Figure 2:
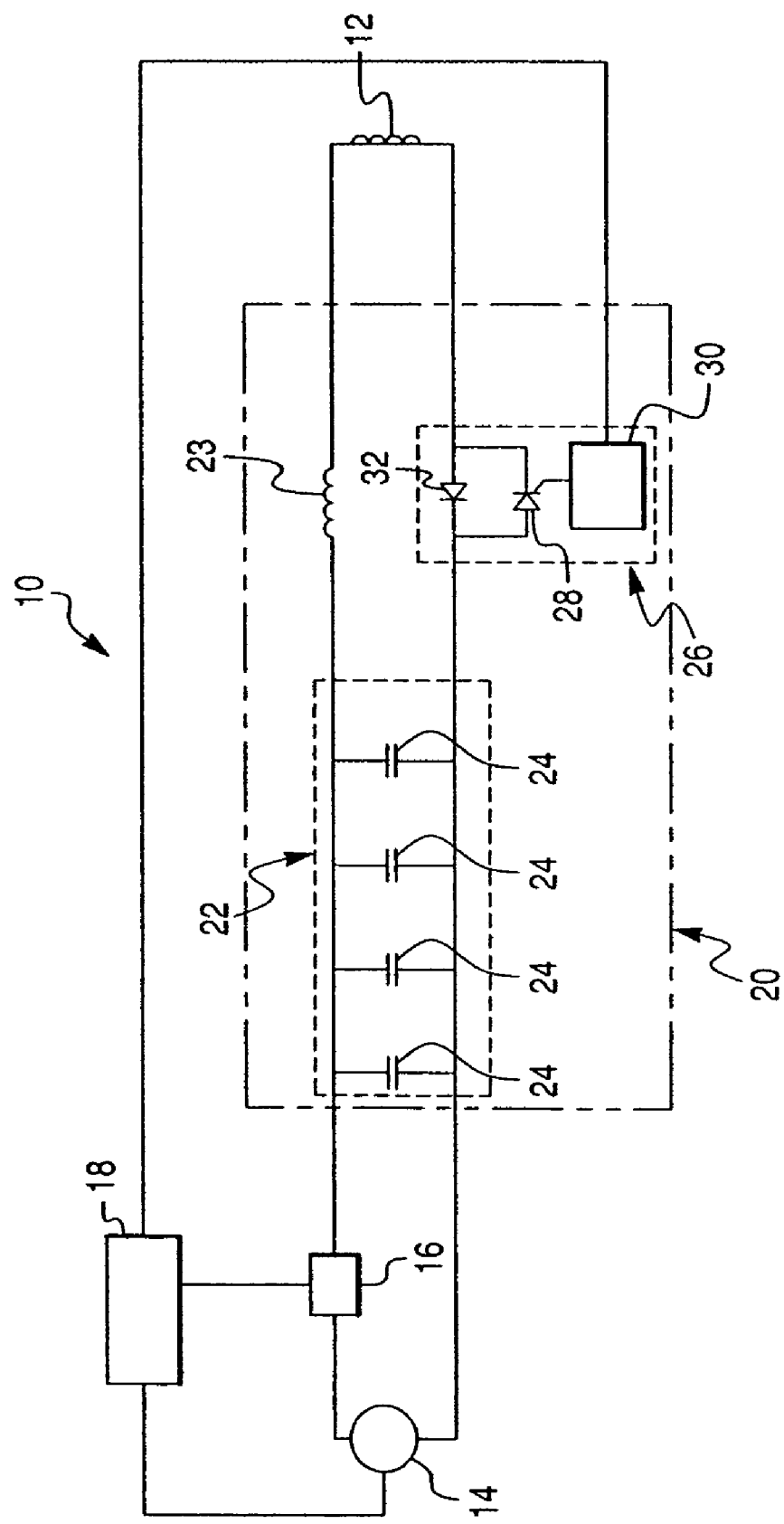
FIG. 2 is a schematic electrical circuit of a pulse power supply module for the pulse power apparatus in accordance with the preferred exemplary embodiment of the present invention.

The preferred exemplary embodiment of each of the pulse power supply modules 20 is illustrated in FIG. 2. As noted above, the pulse power supply modules 20 are substantially identical, and each module 20 includes two main parts: a capacitor bank 22 (capacitance is determined by the overall desired flexibility and application) for storing an electrical energy, a system inductance 23, and a semiconductor switch assembly 26 to transfer the stored electrical energy to the electrical load 12 for a fixed period of time. The semiconductor switch assembly 26 has an input coupled to the capacitor bank 22 for allowing the electrical energy stored in the capacitor bank 22 to be transferred from the capacitor bank 22 to the electrical load.

The use of the solid state switches offers a number of advantages over the pulse power supplies of the prior art: solid state switches are extremely consistent from pulse to pulse (a significant advantage over spark gap and vacuum switches); solid state switches may be easily configured to fire via a fiber-optically transmitted pulse of light (beneficial in high-voltage high-power applications which are inherently dangerous and electrically noisy), solid state switches are easily controlled using almost any conventional PLC, and, finally, proper thermal management of solid state switches enables lifetimes in the tens of millions at high repetition rates as opposed to spark gap and vacuum switches which require maintainance after hundreds to thousands of firings, and ignitrons which are unable to withstand high repetition rates.

The capaciutor bank 22 comprises at least one, but preferably a pluraliuty of capacitors 24 connected in parallel with one another. It will be appreciated that the capacitor bank 22 of the present invention may include any number of the capacitors 24.

In accordance with the preferred embodiment of the present invention, the semiconductor switch assembly 26 includes a semiconductor switch 28 controlled by a pulse generator 30 functioning as an external start/stop trigger, and a diode 32 connected in parallel with the semiconductor switch 28. Preferably, the semiconductor switch 28 is in the form of a semiconductor-controlled rectifier (SCR), such as a semiconductor thyristor. The pulse generator 30 is controlled by the PLC 18. The semiconductor switch 28 in the selected module is actuated to produce the current pulse when triggered by the pulse generator 30, while the diode 32 handles any reverse current which the circuit produces. It will be appreciated that any appropriate SCRs may be used as the semiconductor switch 28 of the present invention. The SCRs chosen for the purpose need to be capable of handling the current, voltage, and frequency of the particular application.

Figure 3A:
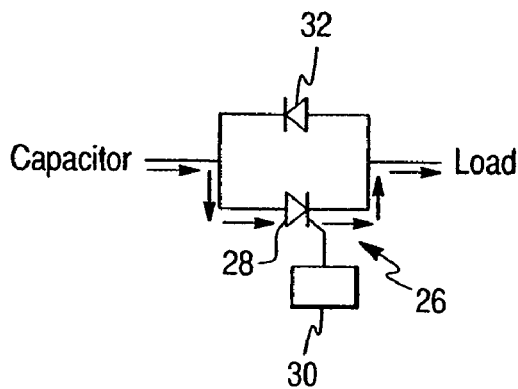
FIG. 3A and FIG. 3B are a schematic electrical circuits of a semiconductor switch assembly in accordance with the preferred exemplary embodiment of the present invention illustrating forward and reverse flow of current therethrough, respectively.
Figure 3B:
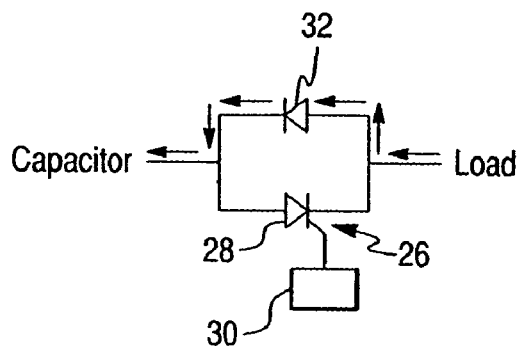

The operation of the pulse power apparatus 10 is as follows: Prior to pulsing, the charging switch 16 is closed, allowing the charging supply from the charging power supply 14 to charge the capacitors 24 of the capacitor bank 22. Once a target charge voltage of the capacitor bank 22 is reached, the charging switch 16 opens by the command from the PLC 18 essentially isolating the charging power supply 14 from the rest of the pulse power apparatus 10. Then, the semiconductor switch assembly 26 is initiated with the pulse generator 30 and the pulse discharge of current is subsequently delivered to the electrical load 12. More specifically, the pulse generator 30 supplies current to a gate of the semiconductor switch 28 thereby initiating a current flow from the anode to cathode. In turn, the pulse generator 30 is operated by the PLC 18. Moreover, the semiconductor switch assembly 26 of the present invention allows current reversal in order to extend duration of application of the electrical energy through the electrical load 12. The current reversal is performed through the diode 32 or other means such as another thyristor or SCR, as illustrated in FIGS. 3A and 3B.

Figure 5A:
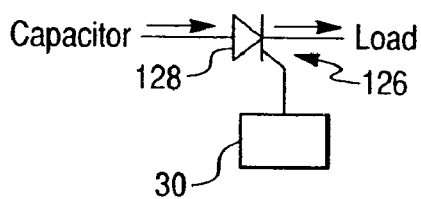
FIG. 5A and FIG. 5B are a schematic electrical circuits of a semiconductor switch assembly in accordance with the alternative embodiment of the present invention illustrating forward and reverse flow of current therethrough, respectively.
Figure 5B:
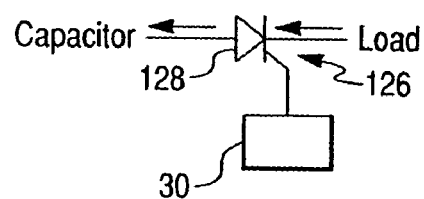
Figure 4:
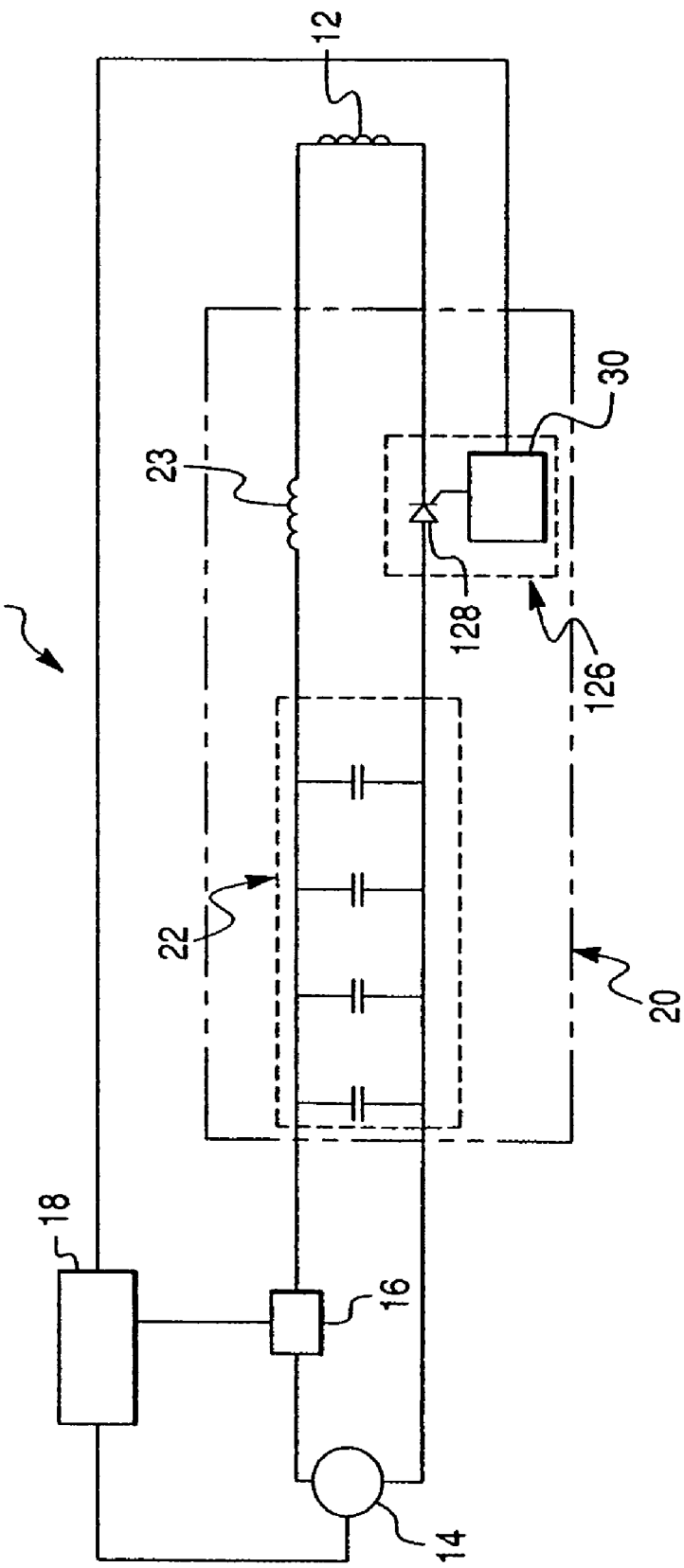
FIG. 4 is a schematic electrical circuit of a pulse power supply module for the pulse power apparatus in accordance with the alternative embodiment of the present invention.

Alternatively, as shown in FIG. 4, the pulse power supply modules 20 may include a semiconductor switch assembly 126 comprising a reverse conducting thyristor 128 operated by the pulse generator 30. In this case, the current reversal can be done with the reverse conducting thyristor 128, as illustrated in FIGS. 5A and 5B.

The shape of the current pulse (the shape of the waveform of current that flows through the electrical load 12) produced in the discharge can be controlled by the semiconductor switch assembly 26 and is greatly dependent of the amount of capacitance used. Correspondingly, the number of the pulse power supply modules 20 and the size of the capacitor in each module and power handling capability of the switch assemblies 26 depend of the nature of the application. Moreover, the shape of the current pulse is controlled entirely by the circuit parameters, such as, depending on the specific application, inductance, resistance, capacitance and voltage. Furthermore, the shape of the current pulse has a great effect on the functionality of the pulse power apparatus 10 in the specific application, such as the quality of the weld in the magnetic pulse welding machine application when the load 12 is in the form of the inductive coil.

This being the case, it would be greatly beneficial to be able to dynamically change the circuit parameters between pulses. This is allowed by the modular approach of the present invention. As the present invention allows employing practically any number of the pulse power supply modules 20, for each additional module the capacitance is incremented, and the peak current is elevated. Furthermore, as the electronic control module 18 controls each the plurality of the pulse power supply modules 20 independently and selectively, the pulse power apparatus 10 has the ability to appropriately select the number of modules 20 used in each pulse, and to fine tune the shape of the pulse to a particular application.

Figure 6:
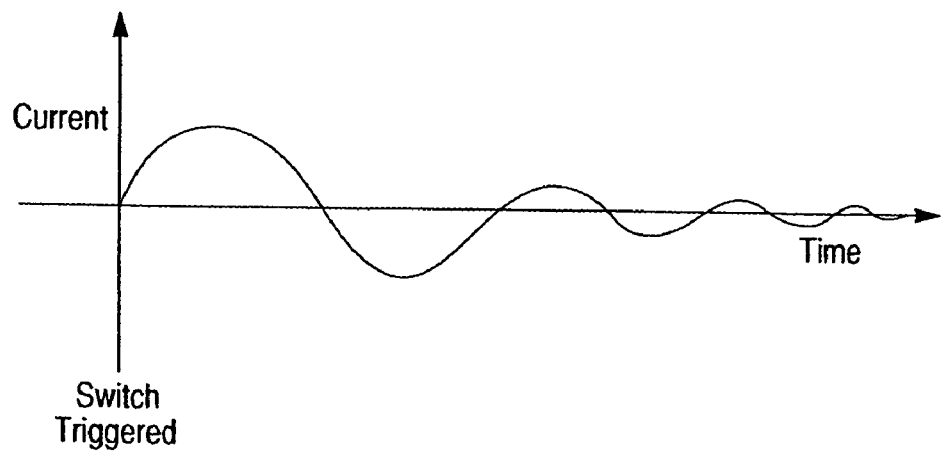
FIG. 6 shows a typical current pulse generated by the pulse power apparatus in accordance with the exemplary embodiment of the present invention.

The FIG. 6 shows a typical current pulse generated by the pulse power apparatus 10 according to the present invention. By choosing the correct components for the pulse power apparatus 10 of the present invention, a wide range of selections is possible.

Therefore, the pulse power apparatus in accordance with the present invention including a plurality of independently and selectively controlled pulse power supply modules, provides a wide range of flexible pulse power supplies.

The foregoing description of the preferred exemplary embodiments of the present invention has been presented for the purpose of illustration in accordance with the provisions of the Patent Statutes. It is not intended to be exhaustive or to limit the invention to the precise forms disclosed. Obvious modifications or variations are possible in light of the above teachings. The embodiments disclosed hereinabove were chosen in order to best illustrate the principles of the present invention and its practical application to thereby enable those of ordinary skill in the art to best utilize the invention in various embodiments and with various modifications as are suited to the particular use contemplated, as long as the principles described herein are followed. Thus, changes can be made in the above-described invention without departing from the intent and scope thereof. It is also intended that the scope of the present invention be defined by the claims appended thereto.

What is claimed is:

1. A pulse power apparatus for generating a pulse through an electrical load, said apparatus comprising:
a charging power supply;
a plurality of pulse power supply modules connected in parallel to each other, each of said plurality of pulse power supply modules including:
at least one capacitor for storing an electrical energy supplied by said charging power supply, said at least one capacitor electrically connected to said electrical load and said charging power supply; and
a semiconductor switch assembly having an input coupled to said at least one capacitor for allowing said stored electrical energy to be transferred from said at least one capacitor to said electrical load for generating said pulse through said electrical load, said semiconductor switch assembly including a semiconductor switch controlled by a pulse generator, said semiconductor switch allowing current reversal therethrough to said at least one capacitor in order to extend duration of application of said electrical energy though said electrical load; and
an electronic control module operatively coupled to said semiconductor switch and said pulse generator of said semiconductor switch assembly of each of said plurality of pulse power supply modules for independently and selectively controlling said plurality of pulse power supply modules in order to selectively transfer said stored electrical energy from said capacitors to said electrical load for a fixed period of time.

2. The pulse power apparatus as defined in claim 1, wherein said at least one capacitor of said at least one pulse power supply module includes a capacitor bank having a plurality of capacitors connected in parallel with one another.

3. The pulse power apparatus as defined in claim 2, wherein said capacitors are substantially identical to each other.

4. A pulse power apparatus for generating a pulse through an electrical load, said apparatus comprising:
a charging power supply;
a plurality of pulse power supply modules connected in parallel to each other, each of said plurality of pulse power supply modules including:
at least one capacitor for storing an electrical energy supplied by said charging power supply, said at least one capacitor electrically connected to said electrical load and said charging power supply; and
a semiconductor switch assembly having an input coupled to said at least one capacitor for allowing said stored electrical energy to be transferred from said at least one capacitor to said electrical load for generating said pulse through said electrical load, said semiconductor switch assembly including a semiconductor switch controlled by a pulse generator, said semiconductor switch allowing current reversal therethrough to said at least one capacitor in order to extend duration of application of said electrical energy through said electrical load; and
an electronic control module operatively coupled to said semiconductor switch and said pulse generator of said semiconductor switch assembly of each of said plurality of pulse power supply modules for independently and selectively controlling said plurality of pulse power supply modules in order to selectively transfer said stored electrical energy from said capacitors to said electrical load for a fixed period of time;
wherein said electrical load is an inductive coil of a magnetic pulse welding machine.

5. The pulse power apparatus as defined in claim 1, wherein said pulse power supply modules are substantially identical to each other.

6. The pulse power apparatus as defined in claim 1, wherein said semiconductor switch assembly further includes a diode connected in parallel with said semiconductor switch.

7. The pulse power apparatus as defined in claim 1, wherein said semiconductor switch is in the form of a semiconductor thyristor.

8. The pulse power apparatus as defined in claim 7, wherein said semiconductor thyristor is a reverse conducting thyristor.

9. The pulse power apparatus as defined in claim 1, wherein said semiconductor switch is in the form of a semiconductor-controlled rectifier.

10. The pulse power apparatus as defined in claim 1, wherein said electronic control module is operatively coupled to said charging power supply for controlling thereof.

11. The pulse power apparatus as defined in claim 10, further comprising a charging switch for allowing the electrical energy from said charging power supply to charge said at least one capacitor of each of said power supply modules; said electronic control module operatively coupled to said charging switch for selectively controlling thereof.

12. The pulse power apparatus as defined in claim 1, wherein each of said plurality of pulse power supply modules includes a plurality of capacitors for storing the electrical energy.

13. A pulse power apparatus for generating a pulse through an electrical load, said apparatus comprising:
a D.C. charging power supply;
a plurality of pulse power supply modules connected in parallel with one another, each of said plurality of pulse power supply modules including:
a plurality of capacitors for storing an electrical energy supplied by said charging power supply; and
a semiconductor switch assembly having an input coupled to said capacitors for allowing the stored electrical energy to be transferred from said capacitors to said electrical load, said semiconductor switch allowing current reversal in order to extend duration of application of the electrical energy through said electrical load,
said semiconductor switch assembly including a semiconductor thyristor controlled by a pulse generator and a diode connected in parallel with said semiconductor switch;
a charging switch for allowing the electrical energy from said charging power supply to charge said capacitors of said pulse power supply modules; and
an electronic control module operatively coupled to said charging power supply, said charging switch and said pulse generator of said semiconductor switch assembly of each of said plurality of pulse power supply modules for independently and selectively controlling said plurality of pulse power supply modules in order to selectively transfer said stored electrical energy from said capacitors to said electrical load for a fixed period of time.

14. A pulse power apparatus for generating a pulse through an electrical load, said apparatus comprising:

a D.C. charging power supply;

a plurality of pulse power supply modules connected in parallel with one another, each of said plurality of pulse power supply modules including:

a plurality of capacitors for storing an electrical energy supplied by said charging power supply; and a semiconductor switch assembly having an input coupled to said capacitors for allowing the stored electrical energy to be transferred from said capacitors to said electrical load, said semiconductor switch allowing current reversal in order to extend duration of application of the electrical energy through said electrical load, said semiconductor switch assembly including a reverse conducting thyristor controlled by a pulse generator;

a charging switch for allowing the electrical energy from said charging power supply to charge said capacitors of said pulse power supply modules; and an electronic control module operatively coupled to said charging power supply, said charging switch and said pulse generator of said semiconductor switch assembly of each of said plurality of pulse power supply modules for independently and selectively controlling said plurality of pulse power supply modules in order to selectively transfer said stored electrical energy from said capacitors to said electrical load for a fixed period of time.

15. The pulse power apparatus as defined in claim 4, wherein said semiconductor switch assembly further includes a diode connected in parallel with said semiconductor switch.

16. The pulse power apparatus as defined in claim 4, wherein said semiconductor switch is in the form of a semiconductor thyristor.

17. The pulse power apparatus as defined in claim 16, wherein said semiconductor thyristor is a reverse conducting thyristor.

18. The pulse power apparatus as defined in claim 4, wherein said semiconductor switch is in the form of a semiconductor-controlled rectifier.

* * * * *